(12) United States Patent
Grunzke

(10) Patent No.: US 9,484,070 B2
(45) Date of Patent: Nov. 1, 2016

(54) APPARATUSES SUPPORTING MULTIPLE INTERFACE TYPES AND METHODS OF OPERATING THE SAME

(71) Applicant: Micron Technology, Inc., Boise, ID (US)

(72) Inventor: Terry M. Grunzke, Boise, ID (US)

(73) Assignee: Micron Technology, Inc., Boise, ID (US)

(*) Notice: Subject to any disclaimer, the term of this patent is extended or adjusted under 35 U.S.C. 154(b) by 199 days.

(21) Appl. No.: 14/266,165

(22) Filed: Apr. 30, 2014

(65) Prior Publication Data

US 2015/0316969 A1    Nov. 5, 2015

(51) Int. Cl.
*G06F 1/00* (2006.01)
*G11C 5/14* (2006.01)
*G06F 1/26* (2006.01)
*G06F 1/32* (2006.01)
*G11C 7/20* (2006.01)

(52) U.S. Cl.
CPC .............. *G11C 5/147* (2013.01); *G06F 1/266* (2013.01); *G06F 1/3225* (2013.01); *G11C 7/20* (2013.01)

(58) Field of Classification Search
CPC ............................ G06F 1/266; G06F 1/3225
USPC ................................................. 713/310, 300
See application file for complete search history.

(56) References Cited

U.S. PATENT DOCUMENTS

| 2006/0179334 A1* | 8/2006 | Brittain | G06F 1/206 713/320 |
| 2008/0162957 A1* | 7/2008 | Lassa | G06F 1/3253 713/310 |
| 2010/0191984 A1* | 7/2010 | Ghosh | G06F 13/385 713/300 |
| 2014/0059359 A1* | 2/2014 | Bahirat | G06F 1/324 713/300 |
| 2015/0149735 A1* | 5/2015 | Nale | G06F 13/14 711/147 |

OTHER PUBLICATIONS

"Open NAND Flash Interface Specification" Intel Corporation, et al. dated Apr. 2, 2014, 315 pp.
"NAND Flash Interface Interoperability" Jedec Standard: JESD230A (revision of JESDA230), dated Aug. 2013, 46 pp. (Uploaded in 3 parts).

* cited by examiner

*Primary Examiner* — Robert Cassity
(74) *Attorney, Agent, or Firm* — Brooks, Cameron & Huebsch, PLLC

(57) ABSTRACT

Apparatuses supporting multiple interface types and methods operating the same are described. One such method can include providing, to a memory device, a first input/output (I/O) supply voltage corresponding to a first interface type and subsequently determining whether the memory device supports a second interface type having a second I/O supply voltage corresponding thereto. In response to a determination that the memory device supports the second interface type, the method can include adjusting the I/O supply voltage provided to the memory device from the first I/O supply voltage to the second I/O supply voltage.

30 Claims, 2 Drawing Sheets

APPARATUSES SUPPORTING MULTIPLE INTERFACE TYPES AND METHODS OF OPERATING THE SAME

TECHNICAL FIELD

The present disclosure relates generally to semiconductor memory apparatuses and methods, and more particularly, to apparatuses supporting multiple interface types and methods of operating the same.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory. An SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

Memory systems can include a number of discrete memory devices (e.g., packages), which can be multi-chip packages (MCPs), and a memory system itself can be considered a memory device. A MCP can include a number of memory dies and/or chips each having a number of memory units associated therewith. The memory units can execute commands received from a host, report status to the host, and can include a number of memory arrays along with peripheral circuitry. The memory arrays can include memory cells that can be organized into a number of physical groups (e.g., blocks), with each of the groups capable of storing multiple pages of data.

In various memory systems, multiple memory devices are coupled to a controller via a shared bus. The controller can regulate performance of various operations such as erase operations, program operations, and read operations, for example. The interaction between the controller and the multiple memory devices can affect various characteristics of a memory system including power consumption, processing speed, and/or data integrity, among other memory system characteristics.

DETAILED DESCRIPTION

Figure 1:
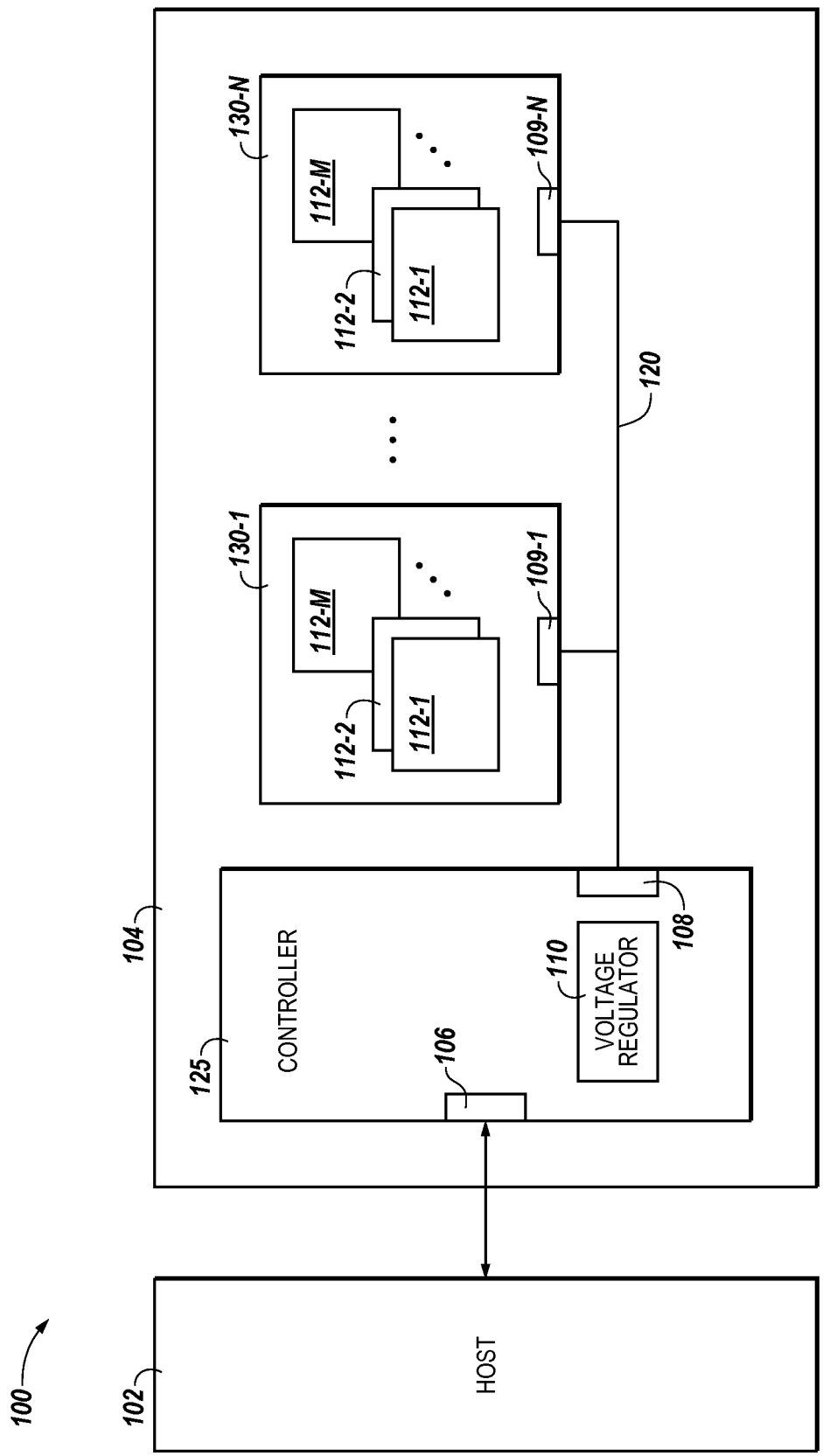
FIG. 1 is a block diagram of an apparatus in the form of a computing system including a memory system comprising a controller supporting multiple data interface types in accordance with a number of embodiments of the present disclosure.

The present disclosure includes apparatuses supporting multiple interface types and methods of operating the same. One such method can include providing, to a memory device, a first input/output (I/O) supply voltage corresponding to a first interface type, subsequently determining whether the memory device supports a second interface type having a second I/O supply voltage corresponding thereto, and adjusting the I/O supply voltage provided to the memory device from the first I/O supply voltage to the second I/O supply voltage in response to a determination that the memory device supports the second interface type.

Embodiments of the present disclosure can provide various benefits such as providing improved flexibility by supporting multiple different interface types, which may operate at different supply voltage levels (e.g., power supply voltage, I/O supply voltage, etc.) and/or providing reduced power consumption as compared to previous approaches, among other benefits. For instance, some memory devices (e.g., NAND devices) may be compatible with a number of different interface types that may be configured to operate at a different I/O supply voltages. In various instances, it can be beneficial to operate such memory devices at a lower I/O supply voltage in order to reduce power consumption, for example. However, in various previous approaches, a controller may not be capable of supporting different supply voltages, which may have resulted in a memory device being operated at higher I/O supply voltage than at which it was capable of operating. As such, it can be beneficial for a controller to determine whether a memory device to which it is coupled supports a particular interface type (e.g., an interface type having a lowermost I/O supply voltage corresponding thereto), and then operate the memory device using the I/O supply voltage corresponding to the particular interface type (e.g., as opposed to a higher than necessary I/O supply voltage).

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 206 in FIG. 2. As used herein, "a number of" something can refer to a one or more of such things.

FIG. 1 is a block diagram of an apparatus in the form of a computing system 100 including a memory system 104 comprising a controller 125 supporting multiple data interface types in accordance with a number of embodiments of the present disclosure. As used herein, a memory system 104, a controller 125, or a memory device 130-1, . . . , 130-N might also be separately considered an "apparatus". The memory system 104 can be a number of solid state drives (SSDs) and can include a controller 125 (e.g., a processor and/or other control circuitry, firmware, and/or software), and a plurality memory devices 130-1, . . . , 130-N (e.g., solid state memory devices such as NAND flash devices) which provide a storage volume for the memory system 104. The memory system 104 can be communicatively coupled to a host 102 via a host interface 106, such as a backplane or bus. In a number of embodiments, the controller 125 can be an application specific integrated circuit (ASIC) coupled to a printed circuit board. The host 102 can include an external processor, for example. However, embodiments are not so limited. For instance, the host 102, controller 125, devices 130-1 to 130-N, and/or components thereof can be on a same die. Similarly, the host 102, controller 125, devices 130-1 to 130-N, and/or components thereof can be on separate dice.

Examples of hosts 102 can include laptop computers, personal computers, digital cameras, digital recording and playback devices, mobile telephones, PDAs, memory card readers, and interface hubs, among other host systems. The host interface 106 can include a serial advanced technology attachment (SATA), peripheral component interconnect express (PCIe), or a universal serial bus (USB), among other connectors and interfaces. In general, however, host interface 106 can provide an interface for passing control, address, data, and/or other signals between the memory system 104 and the host 102.

Host 102 can include a number of processors (e.g., parallel processors, co-processors, etc.) communicatively coupled to controller 125. The number of processors can be a number of microprocessors, or some other type of controlling circuitry, such as a number of application-specific integrated circuits (ASICs), for example. Other components of the computing system 100 may also have processors. The controller 125 can have memory and other components directly communicatively coupled thereto, for example, dynamic random access memory (DRAM), a graphical user interface (GUI), and/or other interface devices (e.g., display monitor, keyboard, mouse, etc.).

Various signals (e.g., data signals, control signals, and/or address signals) can be transmitted between the memory devices 130-1, . . . , 130-N (which may be referred to generally as memory devices 130) and the controller 125 of memory system 104 via a bus 120 between a physical interface 108 of the controller 125 and physical device interfaces 109-1 to 109-N of the respective memory devices 130-1 to 130-N. The device interfaces 109-1 to 109-N can represent a number of data interface types that may be supported by the devices 130 (e.g., SDR (single data rate), DDR (double data rate), nonvolatile DDR (NV-DDR), NV-DDR2, NV-DDR3, etc.). Although the example illustrated in FIG. 1 includes a single bus 120, the memory system 104 can include a separate data bus (DQ bus), control bus, and/or address bus, in some embodiments. The controller 125 and the plurality of memory devices 130 can operate in accordance with the Open NAND Flash Interface (ONFI) standard and/or the Joint Electron Device Engineering Council (JEDEC) standard, in a number of embodiments.

In the example shown in FIG. 1, the bus 120 is shared by the plurality of memory devices 130 and can have various types of bus structures including, but not limited to, bus structures related to Open NAND Flash Interface (ONFI), JEDEC standard, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI). The bus 120 can be a hardwired shared physical bus, for instance.

The memory system 104 can be used in addition to, or in lieu of, a hard disk drive (HDD) in a number of different computing systems. The computing system 100 illustrated in FIG. 1 is one example of such a system; however, embodiments of the present disclosure are not limited to the configuration shown in FIG. 1.

As illustrated in FIG. 1, the memory devices 130 can comprise a number of dies and/or chips that can include a number of memory units 112-1, 112-2, . . . , 112-M providing a storage volume for the memory system 104. The memory units 112-1, 112-2, . . . , 112-M can be referred to as logical units (LUNs) and can include a number of memory arrays and/or peripheral circuitry thereon. In a number of embodiments, the memory units 112-1, 112-2, . . . , 112-M can be the minimum component of memory system 104 capable of independently executing commands from and/or reporting status to the controller 125 and/or host 102 via bus 120. The memory units 112-1, 112-2, . . . , 112-M can include Flash memory arrays having a NAND architecture, for example. However, embodiments are not limited to a particular type of memory array or array architecture.

The memory system 104 can have a number of different power supply voltages associated therewith. As an example, a core supply voltage (e.g., "Vcc") can be used to power the controller 125 and/or memory devices 130, and a separate I/O supply voltage (e.g., "VccQ") can be used to transmit I/O signals between the controller 125 and memory devices 130. The value of the core power supply voltage and the I/O supply voltage can be the same or different and can depend on the interface type supported by the controller 125 and/or devices 130. As one example, a core power supply voltage can be 3.3V and an I/O supply voltage can be 1.8V.

In a number of embodiments, the controller 125 can be configured to support memory devices 130 supporting different interface types (e.g., memory devices supporting multiple data interface types such as NV-DDR, NV-DDR2, NV-DDR3, etc.). Different data interface types can have different I/O supply voltages corresponding thereto, and some data interface types may support multiple different I/O supply voltages. For instance, a memory device supporting an NV-DDR3 interface may operate at an I/O supply voltage of either 1.8V or 1.2V, whereas a memory device supporting NV-DDR2 (but not NV-DDR3) may only be capable of operating at an I/O supply voltage of 1.8V. Although the present embodiment illustrates data interface type as an example interface type, embodiments in accordance with the present disclosure are not so limited. For instance, interface types can include command interface types, command interface types, control interface types, and/or address interface types, among other interface types supported by a memory device and/or device interface.

Since memory devices (e.g., memory devices 130) can support different data interface types and/or different I/O supply voltages corresponding thereto, it can be useful to configure the controller (e.g., controller 125) to provide an appropriate I/O supply voltage to the memory device(s) such that I/O communications occur properly and/or to reduce I/O power consumption, for example. For instance, if a memory device supports a data interface type supporting multiple different I/O supply voltages, it may be beneficial to configure the controller to provide a lowermost of the I/O supply voltages supported by the memory device in order to reduce power consumption associated with I/O operations.

In instances in which the data interface type(s) of the memory device(s) is known, the controller 125 can be configured to provide, upon initialization (e.g., power up) of system 104, a particular I/O supply voltage corresponding to a supported data interface type of the memory device. For example, an input of the controller 125 (e.g., a dedicated hard code), such as a pin or fuse element, can be used to configure the controller 125 to provide a particular I/O supply voltage to the memory device(s). For instance, a pin of the controller can be biased to indicate that a first I/O supply voltage is to be used in association with operating a memory device, and the pin can be left unbiased to indicate a different I/O supply voltage is to be used. Similarly, a number of pins could be biased in a particular manner to indicate which one of a number of different I/O supply voltages are to be used. For instance, two pins can be used to indicate four different voltages, three pins can be used to indicate eight different voltages, etc. A fuse element on the controller can also be used to configure the controller 125 to provide a particular I/O supply voltage. For instance, a blown fuse can be used to indicate a first I/O supply voltage, and an unblown fuse can be used to indicate a different (e.g., second) I/O supply voltage.

As described further below, in a number of embodiments, the controller 125 can determine an interface type (and corresponding I/O supply voltage) supported by memory devices 130 coupled thereto. In various embodiments, the controller 125 can adjust an I/O supply voltage provided to the memory devices 130 based on the determined interface type.

For example, in a number of embodiments, the controller 125 can provide an initial I/O supply voltage to the memory devices 130 during initialization of the memory system 104 (e.g., upon power up of the memory devices 130 and the controller 125). The initial I/O supply voltage can be, for example, a highest I/O supply voltage supported by the controller 125. For example, the initial I/O supply voltage may be equal to a core power supply voltage (e.g., Vcc), or the initial supply voltage may be less than the core power supply voltage and higher than one or more other (e.g., different) I/O supply voltages supported by the controller 125. As such, a number of embodiments can include powering up the memory devices 130 at a core power supply voltage and at an initial I/O supply voltage corresponding to a particular data interface type.

Subsequent to providing the initial I/O supply voltage corresponding to a particular (e.g., first) interface type, the memory system 104 can determine whether the memory devices 130 support another (e.g., second) interface type that can have a different I/O supply voltage corresponding thereto (e.g., an interface type different than the first interface type and having a different corresponding I/O supply voltage). As an example, the first interface type can include NV-DDR2, which may support an I/O supply voltage of 1.8V, and the second interface type can include NV-DDR3, which may support an I/O supply voltage of 1.2V and an I/O supply voltage of 1.8V.

Determining whether a memory device(s) 130 supports the second interface type can comprise providing a command to the memory device(s) 130 via the controller 125 and providing an indication of whether the memory device(s) 130 supports the second interface type to the controller 125 responsive to the command. The command can be, for instance, a read command. The read command can indicate a particular page(s) of data to be read from the memory devices 130. The particular page of data can include, for example, data (e.g., a particular bit or byte) indicating whether the memory device supports a particular interface type and/or providing an indication of a particular interface type supported by the memory device. The read command can be in the form of a read parameter page (Ech) command and/or a read ID command, among other read commands.

The I/O supply voltage provided to the memory device(s) 130 can be adjusted (e.g., from the first I/O supply voltage to the second I/O supply voltage) in response to a determination that the memory device(s) 130 supports the second interface type. The indication can be provided by the memory devices 130 to the controller 125 responsive to the command (e.g., the read command). Adjusting the I/O supply voltage can include decreasing the I/O supply voltage provided to the memory devices 130 from the first I/O supply voltage to the second I/O supply voltage (e.g., via a voltage regulator 110).

In a number of embodiments, the controller 125 can, in response to a determination that the memory device(s) 130 supports the second interface type, issue a command (e.g., a Set Feature command) to the memory device(s) 130 to enable the second interface type. A Set Feature command can refer to a command used, for example, to set and/or modify a mode of operation for a memory device.

Enabling the second interface type can include providing an indication to the memory device(s) 130 that the I/O supply voltage is being adjusted to a different voltage. As an example, a trim bit (e.g., a bit of a feature address corresponding to the Set Feature command) can be set to indicate, to the memory device(s) 130, which interface type is enabled (e.g., which I/O supply voltage is being used). In various embodiments, the set feature can be cleared at a subsequent power cycle.

As illustrated by FIG. 1, in accordance with some embodiments, the memory system 104 can include a voltage regulator 110. In FIG. 1, the voltage regulator 110 is shown as a component of the controller 125; however, embodiments are not so limited. The voltage regulator 110 can include, for example, circuitry (e.g., hardware) configured to adjust the I/O supply voltage.

In a number of embodiments, the controller 125 can be configured to maintain the I/O supply voltage below a first threshold level that is greater than the first I/O supply voltage and to maintain the I/O supply voltage above a second threshold level that is less than the second I/O supply voltage while adjusting the I/O supply voltage of the memory devices 130 from the first I/O supply voltage to the second I/O supply voltage. For example, after a set feature command has been provided to the memory devices 130 to enable the second interface type, the I/O supply voltage of the memory devices 130 is maintained, by the controller 125, below the first threshold level. Further, while decreasing the I/O supply voltage provided to the memory devices 130 from the first I/O supply voltage to the second I/O supply voltage, the I/O supply voltage of the memory devices 130 is maintained above the second threshold level.

As an example, if the first I/O supply voltage is 1.8V and the second I/O supply voltage is 1.2V, the first threshold voltage may be 2.0V and the second threshold voltage may be 1.14V. Maintaining the I/O supply voltage between the first and second threshold levels can reduce or avoid memory device stress.

In various embodiments, the memory system 104 can continue to provide the initial I/O supply voltage to the memory devices 130 in response to a determination that the memory devices 130 do not support the second interface type. For instance, data read from the memory devices 130 responsive to the read command can indicate that the memory devices 130 do not support the second interface type (e.g., and/or an interface type other than the first interface type).

In accordance with a number of embodiments of the present disclosure, the memory system 104 can support and/or include memory devices of more than two different interface types (e.g., more than a first interface type and a second interface type). For example, in some embodiments, the controller 125 can include a plurality of channel controllers (e.g., channel controllers 227 illustrated in FIG. 2). The controller 125 can control access across the plurality of memory channels. The plurality of channel controllers can each control access to a respective memory channel, as discussed further herein. In a number of embodiments, memory devices corresponding to different channels can support different data interface types. For instance, memory devices corresponding to a first channel may support NV-DDR2 and memory devices corresponding to a second channel may support NV-DDR3. In such embodiments, the voltage regulator 110 and/or a plurality of voltage regulators of the controller 125 can be configured to adjust the I/O supply voltage of memory devices corresponding to the particular (e.g., second) channel.

Figure 2:
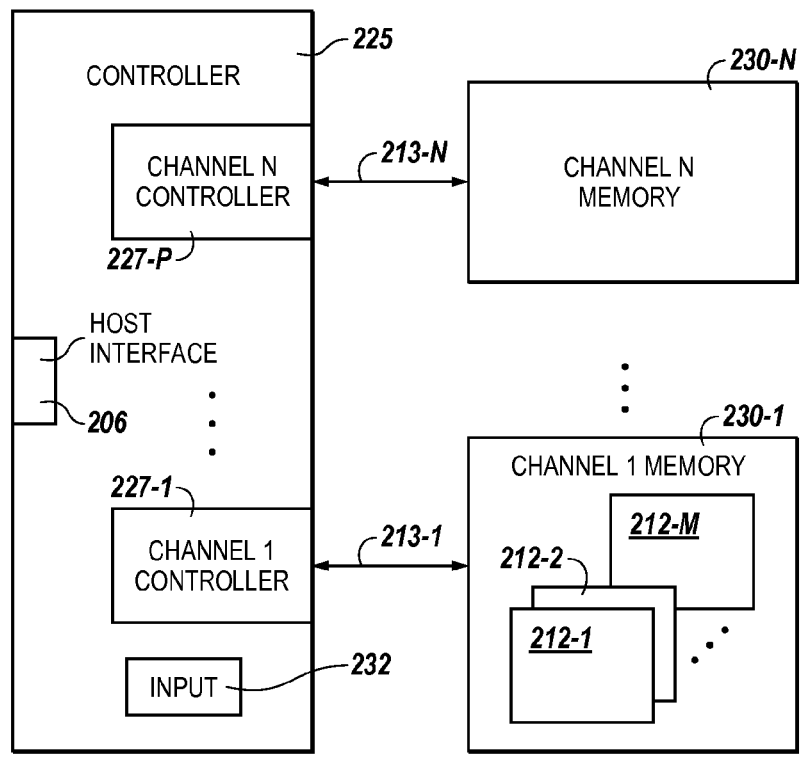
FIG. 2 is a block diagram of a portion of an apparatus in the form of a computing system including a memory system comprising a controller supporting multiple data interface types in accordance with a number of embodiments of the present disclosure.

FIG. 2 is a block diagram of a portion of an apparatus in the form of a computing system including a memory system comprising a controller 225 supporting multiple data interface types in accordance with a number of embodiments of the present disclosure. The memory system illustrated in FIG. 2 includes a plurality of memory channels. For instance, controller 225, which can be analogous to the controller 125 illustrated in FIG. 1, comprises a number of channel controllers 227-1, . . . , 227-N each controlling access to a respective memory channel (e.g., CHANNEL 1 MEMORY, . . . , CHANNEL N MEMORY) via interfaces 213-1, . . . , 213-N. In this example, each channel comprises one memory device (e.g., devices 230-1, . . . , 230-N); however, embodiments are so limited. For instance, each memory channel can comprise multiple memory devices. The memory devices 230-1, . . . , 230-N (referred to generally as memory devices 230) can be a number of dies and/or chips that can include a number of memory units (e.g., memory units 212-1, . . . , 212-M) providing a storage volume for a memory system. A memory unit, which can be referred to as a LUN, can include a number of memory arrays and/or peripheral circuitry thereon. In a number of embodiments, a memory unit can be a minimum component of a memory system capable of independently executing commands from and/or reporting status to the controller 225.

The memory system shown in FIG. 2 includes a host interface 206, through which controller 225 can be coupled to a host such as host 102 shown in FIG. 1. The memory devices 230 can be solid state memory devices, such as NAND flash devices, for example.

In the example shown in FIG. 2, the controller 225 includes an input 232. The input 232 can be, for example, a dedicated pin or fuse element that can be used to configure the controller 225 to provide a particular I/O supply voltage to the memory devices 230. In a number of embodiments, the memory devices 230 corresponding to the different memory channels may support different data interface types. For instance, interface 213-1 may be different than interface 213-N. In some such embodiments, input 232 can comprise multiple inputs (e.g., separate inputs corresponding to respective memory channels). For example, the input 232 can be "N" inputs such that controller 225 can be configured to provide appropriate I/O supply voltages to respective memory devices 230 based on the interface types 213-1 to 213-N supported by the memory devices 230.

As described above, the interfaces 213-1 to 213-N can be data interface types such as NV-DDR2, NV-DDR3, and SDR, among various other data interface types. However, embodiments in accordance with the present disclosure are not limited to data interface types. For example, interface types can include control interface types and/or address interface types, among other interface types. During initialization of the memory system, the input(s) 232 can indicate (e.g., to the controller(s) 227) a particular I/O supply voltage to be provided to the memory devices 230 in association with performing I/O operations. For instance, the input 232 can indicate that one or more of the memory devices 230 support a first interface type having a first I/O supply voltage corresponding thereto. As such, the appropriate controllers 227 can provide the first I/O supply voltage to those one or more memory devices 230. Similarly, the input 232 can indicate that one or more of the memory devices 230 support one of a number of different data interface types (e.g., an interface type other than the first interface type). As such, the appropriate controllers can provide a suitable different I/O supply voltage to those memory devices 230.

Alternatively, in a number of embodiments, although not illustrated by FIG. 2, the memory system and/or the controller 225 comprising the plurality of channels controllers 227 can comprise one or more voltage regulators, such as voltage regulator 110 illustrated in FIG. 1. The voltage regulator(s) can be configured to adjust the I/O supply voltage of one or more memory devices 230 corresponding to a particular memory channel among the number of memory channels. During initialization of the memory system, the controller 225 and/or the memory devices 230 can be powered at an initial I/O supply voltage (corresponding to a particular interface type) of a number of different I/O supply voltages. After powering the controller 125 and the memory devices 230, a read operation can be performed on the memory devices 230.

The read operation, as used herein, can include an operation to take data out of a specified address of the memory devices 230. For example, the read operation can include the controller 225 providing a read command to the memory devices 230 and each of the memory devices 230 returning data indicating whether the respective memory device supports a different interface type than the particular interface type. The memory system can perform a set feature operation on a memory device 230-1 in response to the read operation of the memory device 230-1 resulting in an indication that the memory device 230-1 supports another interface type having a different I/O supply voltage.

The set feature operation, as used herein, can include an operation to modify a setting of a particular feature of a memory device. The set feature operation can include the controller 225 providing a set feature command to the memory device 230-1. As an example, the controller 225 can provide the set feature command to the memory device 230-1 via a memory channel (among a plurality of memory channels) dedicated to providing signals to the memory device 230-1. The voltage regulator(s) can be configured to adjust the I/O supply voltage of the memory device 230-1 from the initial I/O supply voltage to the different I/O supply voltage. Similarly, the voltage regulator(s) can provide a suitable different I/O supply voltage to one or more of the other memory devices 230 in response to an indication that the particular other memory device supports a different interface type than the particular interface type.

Figure 3:
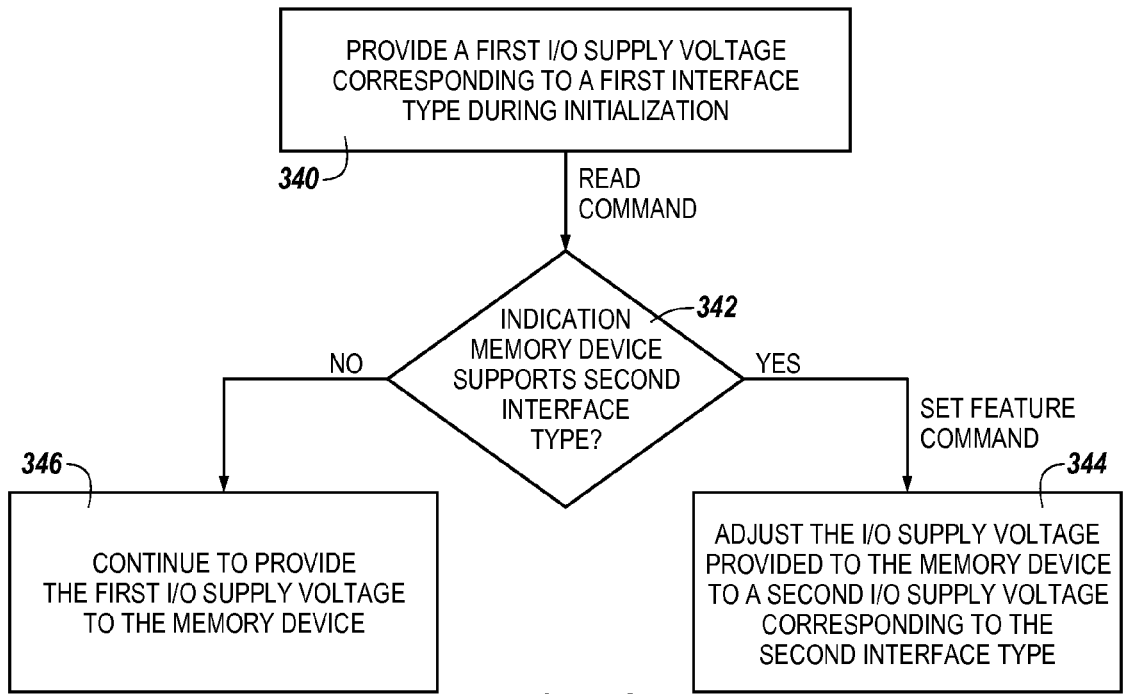
FIG. 3 is a flow chart illustrating a method of operating an apparatus supporting multiple data interface types in accordance with a number of embodiments of the present disclosure.

FIG. 3 is a flow chart illustrating a method of operating an apparatus supporting multiple data interface types in accordance with a number of embodiments of the present disclosure. The method can be applied to various apparatuses such as those described above in FIGS. 1-2.

As illustrated at block 340, a first I/O supply voltage corresponding to a first interface type can be provided to one or more memory devices during initialization. For instance, in some embodiments, a controller can be coupled to a plurality of memory devices and configured to power up the plurality of memory devices at a first core power supply voltage and at a first I/O supply voltage corresponding to the first interface type.

A read command can be provided (e.g., issued) to the one or more memory devices. For instance, the read command can be provided to determine whether the one or more memory devices support a second interface type having a second I/O supply voltage corresponding thereto. In a number of embodiments, a reset command can be provided to the one or more memory devices prior to providing the read command.

For instance, as illustrated at block 342, a determination can be made whether the one or more memory devices support the second interface type. The determination can, for instance, be made based on data returned from the one or more memory devices responsive to the read command. The data returned can indicate whether the respective memory device can and/or cannot support a first interface type, a second interface type, and/or other interface types. Each interface type may support one or more particular I/O supply voltages.

In a number of embodiments, as illustrated at block 344, responsive to a determination that the one or more memory devices support a second interface type, the I/O supply voltage corresponding to the memory device(s) can be adjusted from the first I/O supply voltage to the second I/O supply voltage. Responsive to a determination that the one or more memory devices do not support the second interface type, as illustrated at block 346, the memory device(s) can continue to be provided the first I/O supply voltage. The memory device(s) can be subsequently operated (e.g., powered) at the first or second I/O (or other) supply voltage.

In accordance with some embodiments of the present disclosure, the method can include a plurality of memory devices each configured to support at least one interface type. In such embodiments responsive to a determination that one or more of the plurality of memory devices support the second interface type, the I/O supply voltage corresponding to those memory devices can be adjusted from the first I/O supply voltage to the second I/O supply voltage, as illustrated at block 344. Further, responsive to a determination that one or more of the plurality of memory devices do not support the second interface type, those memory devices can be powered at the first I/O supply voltage, as illustrated by block 346. In various embodiments, at least one of the plurality of memory devices is determined to not support the second interface type and is powered at the first I/O supply voltage and at least one of the plurality of memory devices is determined to support the second interface type and is powered at the second I/O supply voltage. Although embodiments in accordance with the present disclosure are not so limited and the plurality of memory devices can be determined to support the second interface type or not support the second interface type.

In a number of embodiments, the method can include waiting a threshold period of time after adjusting the I/O supply voltage provided to one or more memory devices prior to providing a subsequent command to the one or more memory devices. For example, the memory system and/or the controller can be configured to prevent the one or more memory devices from receiving commands during, while, and/or after (e.g., for a threshold period of time) an adjustment of the I/O supply voltage from the first I/O supply voltage to a second I/O supply voltage. The memory system and/or the controller can wait the threshold period of time after adjusting the I/O supply voltage before issuing a subsequent command. An example threshold period of time can include 50 microseconds.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "a number of A and B."

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
providing, to a memory device, a first input/output (I/O) supply voltage corresponding to a first interface type;
subsequently determining, based at least in part on a read operation, whether the memory device supports a second interface type having a second I/O supply voltage corresponding thereto;
issuing a set feature command to the memory device to enable the second interface type; and
adjusting the I/O supply voltage provided to the memory device from the first I/O supply voltage to the second I/O supply voltage in response to a determination that the memory device supports the second interface type.

2. The method of claim 1, wherein determining whether the memory device supports the second interface type comprises:
providing a command to the memory device via a controller; and
providing an indication of whether the memory device supports the second interface type to the controller responsive to the command.

3. The method of claim 1, comprising continuing to provide, to the memory device, the first I/O supply voltage in response to a determination that the memory device does not support the second interface type.

4. The method of claim 1, wherein adjusting the I/O supply voltage comprises decreasing the I/O supply voltage provided to the memory device from the first I/O supply voltage to the second I/O supply voltage.

5. The method of claim 1, comprising waiting a threshold period of time after adjusting the I/O supply voltage provided to the memory device prior to providing a subsequent command to the memory device.

6. An apparatus comprising:
a host interface,
a device interface, and
circuitry configured to:
responsive to a power up of the apparatus and to a power up of a memory device at a first input/output (I/O) supply voltage corresponding to a first interface type supported by the device interface, perform a read operation on the memory device to determine that the memory device supports a second interface type; and
responsive to the read operation resulting in the determination that the memory device supports a second interface type supported by the device, the second interface having a second I/O supply voltage corresponding thereto, perform a set feature operation on the memory device to:
enable the second interface type; and
adjust the I/O supply voltage of the memory device to the second I/O supply voltage.

7. The apparatus of claim 6, wherein the circuitry configured to the read operation comprises the circuitry configured to:
provide a read command to a particular page of data, and wherein the particular page of data includes data indicating an interface type supported by the memory device, the interface type having a particular I/O supply voltage corresponding thereto.

8. The apparatus of claim 6, wherein the apparatus is configured to prevent the memory device from receiving commands during an adjustment of the I/O supply voltage from the first I/O supply voltage to the second I/O supply voltage.

9. A method comprising:
powering a controller and powering a plurality of memory devices at a first input/output (I/O) supply voltage of a number of different I/O supply voltages during initialization, the first I/O supply voltage corresponding to a first interface type;
after powering the controller and the plurality of memory devices, performing a read operation on the plurality of memory devices, the read operation to determine that a first memory device among the plurality of memory devices corresponds to a second interface type;
performing a set feature operation on the first memory device of the plurality of memory devices in response to the read operation of the first memory device resulting in an indication that the first memory device supports the second interface type having a second I/O supply voltage from among the number of different I/O supply voltages corresponding thereto; and
operating the first memory device at the second I/O supply voltage.

10. The method of claim 9, wherein the first I/O supply voltage comprises a highest I/O supply voltage from among the number of different I/O supply voltages.

11. The method of claim 9, wherein the second I/O supply voltage comprises a lower I/O supply voltage than the first I/O supply voltage.

12. The method of claim 9, including clearing the set feature at a subsequent power cycle.

13. The method of claim 9, wherein a second memory device of the plurality of memory devices remains at the first I/O supply voltage in response to the read operation of the second memory device resulting in an indication that the second memory device does not support a different interface type having a lower I/O supply voltage than the first I/O supply voltage.

14. The method of claim 9, comprising:
performing a set feature operation on a second memory device of the plurality of memory devices in response to the read operation of the second memory device resulting in an indication that the second memory device supports a third interface type having a third I/O supply voltage from among the number of different I/O supply voltages; and
operating the second memory device at the third I/O supply voltage.

15. The method of claim 14, wherein the third I/O supply voltage is lower than the first I/O supply voltage and higher than the second I/O supply voltage.

16. An apparatus, comprising:
a memory device configured to support at least one interface type; and
a controller coupled to the memory device and configured to:
power up the memory device at a first I/O supply voltage corresponding to a first interface type;

determine, based at least in part on a read operation, whether the memory device supports a second interface type having a second I/O supply voltage corresponding thereto;
responsive to a determination that the memory device supports the second interface type:
issue a set feature command to enable the second interface type; and
adjust the I/O supply voltage from the first I/O supply voltage to the second I/O supply voltage; and
responsive to a determination that the memory device does not support the second interface type, powering the memory device at the first I/O supply voltage.

17. The apparatus of claim 16, wherein first interface type is NV-DDR2 interface and second interface is NV-DDR3 interface.

18. The apparatus of claim 16, wherein the controller comprises a voltage regulator configured to adjust the I/O supply voltage from the first I/O supply voltage to the second I/O supply voltage.

19. The apparatus of claim 16, wherein the controller is coupled to the memory device via at least one of an Open NAND Flash Interface (ONFI) and a Joint Electron Device Engineering Council (JEDEC) standard.

20. The apparatus of claim 16, wherein the controller configured to determine whether the memory device supports a second interface type having a second I/O supply voltage corresponding thereto includes:
the controller configured to provide a read command to the memory device; and
the memory device configured to return data indicating whether the memory device supports the second I/O interface type.

21. The apparatus of claim 20, wherein the controller is configured to provide a reset command to the memory device prior to providing the read command.

22. The apparatus of claim 16, wherein controller is further configured to, while adjusting the I/O supply voltage from the first I/O supply voltage to the second I/O supply voltage:
maintain the I/O supply voltage below a first threshold level that is greater than the first I/O supply voltage; and
maintain the I/O supply voltage above a second threshold level that is less than the second I/O supply voltage.

23. The apparatus of claim 16, wherein the first I/O supply voltage and the second I/O supply voltage are different than a core power supply voltage of the controller.

24. The apparatus of claim 16, further comprising a host coupled to the controller via a host interface, wherein the host is an external processor.

25. An apparatus, comprising:
a plurality of memory devices each configured to support at least one interface type; and
a controller coupled to the plurality of memory devices and configured to:
power up the plurality of memory devices at a first core power supply voltage and at a first I/O supply voltage corresponding to a first interface type;
issue a read command to the plurality of memory devices to determine whether the plurality of memory devices support a second interface type having a second I/O supply voltage corresponding thereto;
receive an indication that one or more of the memory devices supports the second interface type;
responsive to the indication that one or more of the plurality of memory devices support the second interface type;
issue a set feature command to enable the second interface type;
adjust the I/O supply voltage corresponding to those memory devices from the first I/O supply voltage to the second I/O supply voltage; and
responsive to a determination that one or more of the plurality of memory devices do not support the second interface type, powering those memory devices at the first I/O supply voltage.

26. The apparatus of claim 25, wherein:
at least one of the plurality of memory devices is determined to not support the second interface type and is powered at the first I/O supply voltage; and
at least one of the plurality of memory devices is determined to support the second interface type and is powered at the second I/O supply voltage.

27. The apparatus of claim 25, wherein the controller is prevented from providing commands to the one or more of the plurality of memory devices while the I/O supply voltage is adjusted from the first I/O supply voltage to the second I/O supply voltage.

28. A controller, comprising:
a host interface;
a device interface;
circuitry configured to communicate with a host via the host interface and to communicate with a memory device via the device interface; and
an input operated to configure the controller to power the memory device using one of at least two different input/output (I/O) supply voltages supported by the device interface by:
determining, based at least in part on a read operation, that the memory device supports the one of at least two I/O supply voltages;
receiving an indication that the memory device supports the one of at least two different I/O supply voltages; and
issuing a set feature command to enable a particular interface type among respective different interface types;
wherein the at least two different I/O supply voltages correspond to the respective different interface types; and
wherein the at least two different I/O supply voltages are different than a core power supply voltage used to power the memory device and/or the controller.

29. The controller of claim 28, wherein the input comprises a dedicated pin of the controller.

30. The controller of claim 28, wherein the input comprises a fuse element.

* * * * *